United States Patent [19]

Traficante et al.

[11] 4,075,552

[45] Feb. 21, 1978

[54] WIDE-BAND NUCLEAR MAGNETIC RESONANCE SPECTROMETER

[76] Inventors: Daniel D. Traficante, 16 Fairbanks Road; Michael Mulcay, 21 Grant Place, both of Lexington, Mass. 02173

[21] Appl. No.: 571,433

[22] Filed: Apr. 24, 1975
(Under 37 CFR 1.47)

[51] Int. Cl.² .............................................. G01N 27/00
[52] U.S. Cl. .............................. 324/0.5 AH; 324/.5 A
[58] Field of Search ................. 324/.5 R, .5 A, .5 AH

[56] References Cited

U.S. PATENT DOCUMENTS

| | | | |
|---|---|---|---|
| 3,638,104 | 1/1972 | Wright | 324/.5 A |
| 3,753,097 | 8/1973 | Dunand | 324/.5 A |
| 3,789,832 | 2/1974 | Damadian | 324/.5 A |

OTHER PUBLICATIONS

McKay et al., "A Simple Single-coil Probe for Pulsed Nuclear Magnetic Resonance," J. Sci. Instrum., vol. 43, 1966, pp. 838-840.
Buchta et al., "Nuclear Resonance Pulse Apparatus," The Review of Scientific Instruments, vol. 29, No. 1, Jan. 1958, pp. 55-60.
Vaughan, "A Simple Low Power, Multiple Pulse Spectrometer," Rev. Sci. Inst., vol. 43, No. 9, Sept. 1972, pp. 1356-1364.
Trafioante, "An Approach to Multinuclei Capability in Modern NMR Spectrometers," Journal of Mag. Resonance, Mar. 25, 1974, 15, pp. 484-497.

*Primary Examiner*—Rudolph V. Rolinec
*Assistant Examiner*—Michael J. Tokar
*Attorney, Agent, or Firm*—McAulay, Fields, Fisher & Goldstein

[57] ABSTRACT

The wide-band nuclear magnetic resonance spectrometer is used for determining the NMR frequency of a sample in an external magnetic field and comprises a transmitter for generating a signal having a frequency equal to the NMR frequency of the sample. A receiver receives the signal from the sample and a probe is provided for applying the signal from the transmitter to the sample and from the sample to the receiver. The probe comprises a detector in the form a tank circuit for detecting the signal of NMR frequency from the sample and for inductively coupling the detector to the receiver and for substantially matching the impedance of the receiver.

16 Claims, 5 Drawing Figures

WIDE-BAND NUCLEAR MAGNETIC RESONANCE SPECTROMETER

The present invention relates to a nuclear magnetic resonance spectrometer and, more particularly, pertains to a nuclear magnetic resonance spectrometer that is wide-band in operation and thereby requires a minimum of elements for its operation.

Nuclear magnetic resonance (NMR) spectrometers are utilized to determine the nuclear magnetic resonance frequency of various substances. The operation of such spectrometers is based upon the fact that the nucleus of a substance may have a net spin which gives rise to a nuclear magnetic moment. At room temperatures, the nuclei in a sample of the substance are divided between high and low energy states with the greater quantity of nuclei residing in the low energy state. When such substance is placed in an external magnetic field, the interaction between the magnetic field vector and the nuclear magnetic moment produces a torque which interacts with the angular momentum of the nucleus and causes the magnetic moment to precess about the applied field vector. If energy at the precession frequency or so-called resonance frequency is applied to the substance or sample, an exchange of energy occurs wherein energy is absorbed by the low energy nuclei which then rise to the high energy level. Since this condition is an unstable condition, the nuclei eventually fall back to the low energy state thereby radiating energy at the same resonant frequency.

In an NMR spectrometer, a sample of the unknown substance is placed in a magnetic field of known intensity. A transmitter is then swept through a frequency band and the transmitted signal is applied to the sample via a probe. The probe is inductively coupled to the sample. When the NMR frequency is reached, energy will be absorbed by the sample and will also be radiated by the sample. The received signal is applied to a receiver via the probe and indicates the NMR frequency of the sample. The value of the NMR frequency is then compared to the known NMR frequencies of different substances to identify the particular sample under consideration.

In order for the spectrometer to operate properly, the probe must be tuned to the particular NMR frequency under consideration. Since the transmitter is swept through an extremely wide band, in present day practice it has been found impractical to utilize a single probe. That is, since the signal returned by the probe to the receiver is of low amplitude, it is necessary that the impedance of the probe be matched to the impedance of the receiver in order to obtain maximum power transfer. As a result, present commercial spectrometers utilize a plurality of different probes depending upon the particular portion of the bandwidth that the transmitter is being swept through. This not only increases the overall cost of such spectrometers, but requires the operator to keep changing the probe each time the transmitter is swept through a different portion of the bandwidth.

Accordingly, an object of the present invention is to provide an improved nuclear magnetic resonance spectrometer.

A more specific object of this aspect of the invention is the provision of an NMR spectrometer that utilizes a minimum number of elements for operation thereof.

A further object of the present invention is to provide a wide-band NMR spectrometer that may be used over substantially the entire bandwidth of the transmitter.

A further object of the present invention is the provision of a wide-band nuclear magnetic resonance spectrometer that is reliable in operation and economical to produce.

Another object of the present invention resides in the novel details of construction that provide wide-band elements for a spectrometer of the type described thereby substantially decreasing the overall cost of such devices.

Accordingly, a wide-band nuclear magnetic resonance spectrometer for determining the NMR frequency of a sample in an external magnetic field of the type under consideration comprises a system having transmitting means for generating a signal having a frequency equal to the NMR frequency of the sample. Receiving means is adapted to receive the signal from the sample and probe means is provided for applying the signal from the transmitting means to the sample and for applying the signal from the sample to the receiving means. The probe means comprises detecting means for detecting the signal of NMR frequency from the sample, and coupling mens for inductively coupling the detecting means to the receiving means.

A feature of the present invention resides in providing wide-band elements that may be utilized in existing constructions thereby converting such constructions to wide-band spectrometers.

Other features and advantages of the present invention will become more apparent from a consideration of the following detailed description, when taken in conjunction with the accompanying drawings, in which.

Figure 2:
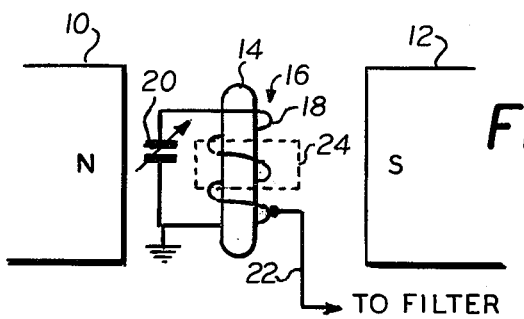
FIG. 2 is a diagrammatic representation of the probe and magnets of the present invention.

As noted above, the present invention relates to a wide-band nuclear magnetic resonance spectrometer. Accordingly, only those portions of a conventional spectrometer necessary for an understanding of the present invention will be discussed in detail herein. If the reader is interested in obtaining additional information on such spectrometers, the reader is referred to the text by Ruth Lynden-Bell and R. K. Harris, entitled NUCLEAR MAGNETIC RESONANCE SPECTROSCOPY, published by the Educational Division of Appleton-Century-Crofts, Meredith Corporation, 440 Park Ave. South, New York, N.Y. 10016. Very briefly, however, spectrometers of the type under consideration include magnetic poles 10 and 12 (FIG. 2) which produce a magnetic field of known intensity. Conventional feedback techniques are employed to maintain the magnetic field constant. A sample 14 of the substance to be determined is placed between the poles of the magnet and is subjected to the constant magnetic field thereby producing a precession of the magnetic moment of the nuclei of the substance. A probe designated generally by the reference character 16 includes a coil 18 that surrounds the sample 14 that may be contained in a vial or the like. The coil 18 is electromagnetically coupled to the sample 14. A variable capacitor 20 is connected in parallel with the coil 18 to form a tank or resonant circuit that is resonant at the NMR frequency of the sample. A lead 22 connects the probe to the remainder of the circuitry. As shown in FIG. 2, one end of the tank circuit is grounded. As noted in greater detail below, a pulsed transmitter signal is applied to the probe 16 via the lead 22 and, when the frequency of the transmitted signal is equal to the NMR frequency of the sample, energy will be absorbed by the sample. Additionally, energy will be radiated from the sample and will be applied to the receiver via the lead 22.

The arrangement shown in FIG. 2 is known as a single coil system wherein the coil 18 serves to couple energy to the sample and to remove energy from the sample. Alternatively, a two-coil system may be utilized wherein a coil 24 is oriented orthogonally to the coil 18. The coil 24 is connected to the transmitter and the coil 18 is connected to the receiver so that energy is coupled to the sample via the coil 24 and is removed from the sample via the coil 18.

Figure 1:
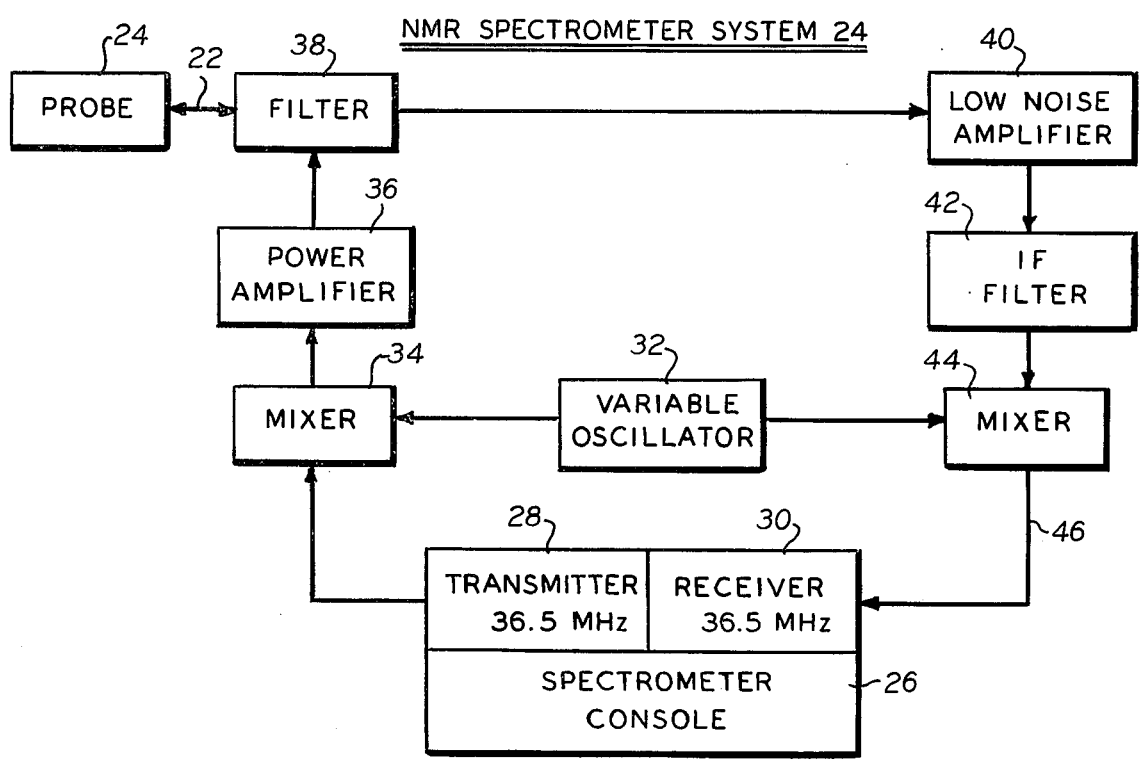
FIG. 1 is a schematic circuit wiring diagram, in block diagram form, showing the system of the present invention.

The system of the present invention is shown in FIG. 1 and is designated generally by the reference character 24. The system 24 is a coherent heterodyne system, as noted in greater detail below. The system 24 includes a spectrometer console 26 of known construction such as the Bruker HFX-90 NMR Spectrometer, manufactured by the Bruker Magnetics, Inc. Company of Burlington, Mass. The spectrometer 26 includes a transmitter 28 that produces a 36.5 MHz signal and a receiver 30 that is adapted to receive the 36.5 MHz signal. A variable oscillator 32 is provided that is connected to both the transmitting and receiving chain to apply a coherent signal to both chains. More specifically, the transmitter 28 is connected to a mixer 34. The variable oscillator 32 is also connected to the mixer 34 so that the mixer produces signals having both the sum and the difference frequencies between the frequencies of the signals produced by the transmitter and the variable oscillator. The signals from the mixer 34 are applied to a power amplifier 36 that amplifies the signals at the mixer output and applies the same to a low-pass filter 38. The filter 38 passes only those frequencies in the band under consideration and applies signals having the desired frequencies to the probe 24 which is connected to the filter 38 via the lead 22.

Signals received by the probe 24 from the sample 14 are applied to the filter 38 and, through the filter, to a low noise amplifier 40 which is connected to the output terminals of the filter. As noted in greater detail below, a reflecting device is provided in the filter and the low noise amplifier so that the transmitted signal from the amplifier 36 is reflected away from the input terminals of the low noise amplifier 40 and back to the probe 24 thereby preventing the high powered signals from the transmitting chain from entering the low noise amplifier. In other words, only signals radiated from the sample 14 will be applied to the low noise amplifier 40 via the probe 24 and filter 38. The output terminals of the low noise amplifier are connected to an intermediate frequency or IF frequency filter 42. The output terminals of the filter 42 are connected to a mixer 44 in the receiving chain. The filter 42 is a low-pass filter that is set to attenuate image frequency noise signals from the amplifier 40. The mixer 44 also receives signals from the variable oscillator 32 and mixes the signals from the filter 42 and oscillator 32 to produce sum and difference frequency signals at the output terminals thereof which are connected to a receiver 30 via a lead 46.

In an actual embodiment of the system 24, a sample of tin having an NMR frequency of 33.5 MHz was utilized. The variable oscillator 32 was set at a frequency of 70 MHz so that the output signals of mixer 34 had frequencies of 106.5 MHz and 33.5 MHz. These signals were amplified by the amplifier 36 and were applied to the low-pass filter 38. The low-pass filter 38 has a cut-off frequency that is slightly above the highest frequency in the band under consideration. Accordingly, the 33.5 MHz signal will pass through the filter whereas the 106.5 MHz will be attenuated by the filter. Energy from the transmitted signal will be absorbed by the sample via the probe 24 and energy at that frequency will also be radiated from the sample. Since the transmitter produces pulses, it is to be understood that the signals radiated by the sample will be received during the intervals between transmitted pulses. The radiated signal at 33.5 MHz will pass through the filter 38 and the low noise amplifier 40 and, through the IF filter 42 to the mixer 44. The filter 38 prevents undesired frequency signals that may be applied to the probe 24 by external circuits such as proton decoupling amplifiers, etc. from reaching the low noise amplifier 40, in addition to attenuating the unwanted output signals of the mixer 34. The filter 42, which is likewise a low-pass filter and has a cut-off at 50 MHz, prevents unwanted signals at the image frequency of 106.5 MHz from passing to the mixer 44. The 33.5 MHz signal applied to the mixer 44 is mixed with the signal of 70 MHz from the oscillator 32 to produce signals of 103.5 MHz and 36.5 MHz on the lead 46. The 36.5 MHz signal will be received by the receiver 30 which indicates to the operator that the sample under consideration does, in fact, have an NMR frequency of 33.5 MHz.

From the above example, it will become obvious that if the sample under consideration is changed to a sample having a different NMR frequency, only the setting on the variable oscillator 32 need be changed. Since the probe and filter 38 are substantially wide-band, no changes need be made in these elements. Additionally, if the unwanted frequency from mixer 34 is substantially equal to the lock frequency (utilized to maintain the magnetic field constant) a notched filter may be placed either after mixer 34 or after the power amplifier 36.

Figure 3:
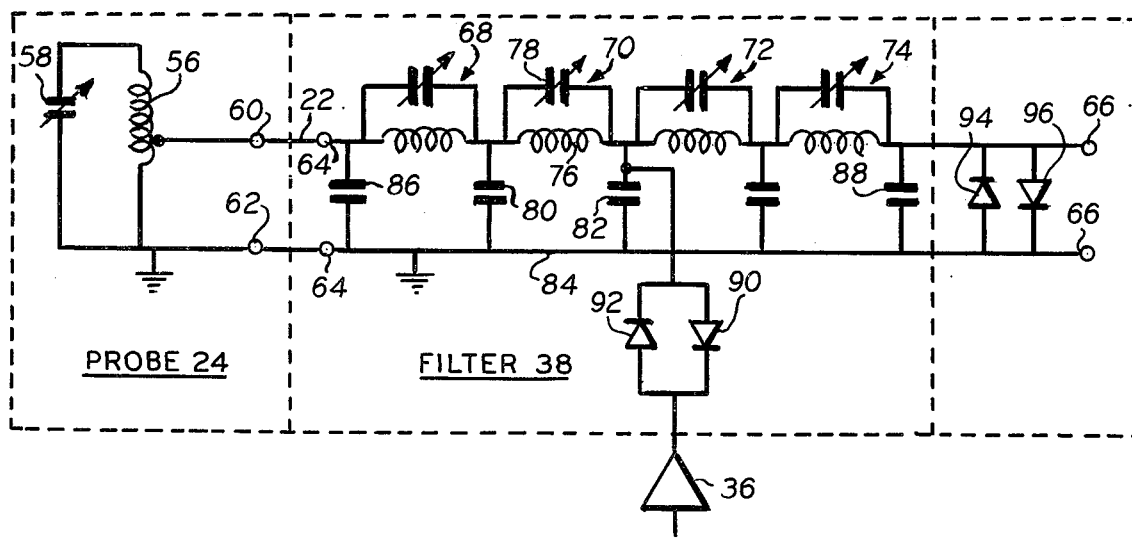
FIG. 3 is a schematic circuit wiring diagram of the probe and portions of the receiver of the present invention.
Figure 4:
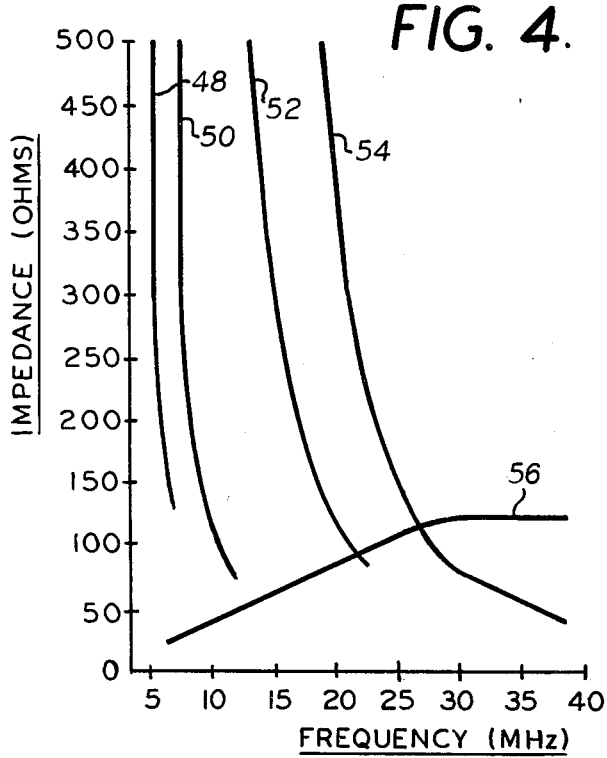
FIG. 4 is a graph illustrating the relationship between impedance and frequency for prior art probes and the probe of the present invention.
Figure 5:
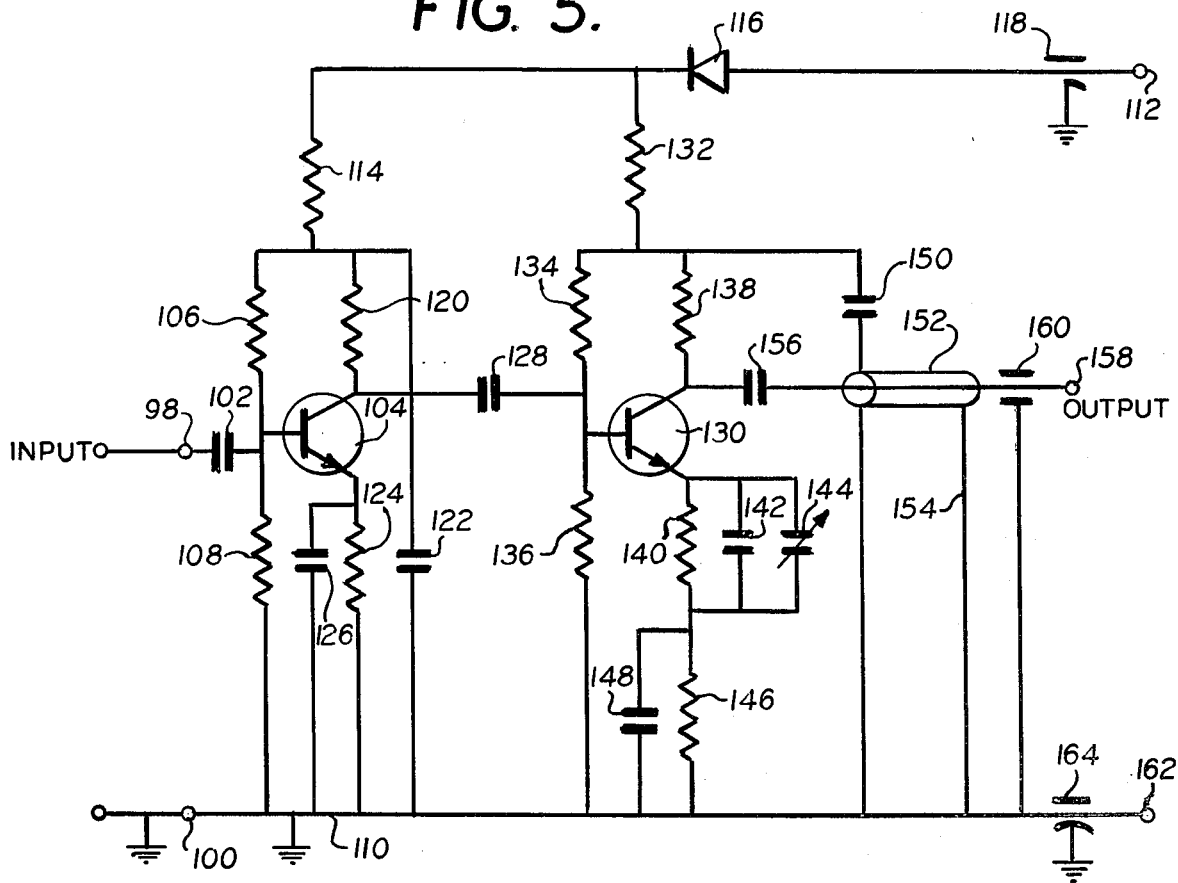
FIG. 5 is a schematic circuit wiring diagram of an amplifier that may be used in conjunction with the receiver of the present invention.

A schematic circuit wiring diagram of various elements comprising the system 24 are shown in FIGS. 3 and 5. More specifically, and as noted above, the signal radiated from the sample is of relatively low magnitude and it is imperative that the impedance of the probe be matched to the impedances of the remainder of the system. Prior art probes utilized a capacitive coupling between the signal detecting portion of the probe and the output terminals. This capacitive coupling influenced the impedance of the probe to a substantial degree over the range of frequencies under consideration. As a result, different probes were required to be used for different bands of frequencies. FIG. 4 illustrates actual variations in impedance as a function of frequency for probes that are presently utilized in commercial spectrometers. Thus, curves 48–54 show that the impedance of presently available probes varies substantially over the frequencies of interest. On the other hand, curve 56 illustrates the impedance of the probe of the present invention over the frequency band of interest. When it is realized that the impedance of the filter and low noise amplifier is 75 ohms, it will be appreciated that the impedance of the probe of the present invention is substantially matched to the impedance of the system over the entire band of frequencies of interest. For a more detailed explanation of the probes of the prior art, the reader is referred to the inventors' article on the present system, entitled "An Approach to Multinuclei Capability in Modern NMR SPectrometers" by Daniel D. Traficante, James, A. Simms, and Michael Mulcay in the Journal of Magnetic Resonance, Vol. 15, No. 3, published September, 1974 by the Academic Press, Inc.

As shown in FIG. 3, the probe 24 of the present invention includes an autotransformer 56, the larger winding or first coil of which is connected in parallel with a variable capacitor 58. The smaller winding or second coil of the autotransformer 56 is connected between terminals 60 and 62. The terminal 60 is connected to the lead 22 and the terminal 62 is connected to ground. In other words, the primary winding of the autotransformer comprises the portion having the lower number of turns and is connected to the filter 38. On the other hand, the secondary winding of the autotransformer, which comprises the portion having the larger number of turns, is connected across the variable capacitor 58. In operation, the capacitor 58 is varied in accordance with the NMR frequency under consideration so that the capacitor 58 and the transformer 56 form a tank circuit that resonates at the NMR frequency.

In an actual construction, the autotransformer 56 comprised a coil having a 13 mm diameter and a 12 mm length and a measured inductance of 1.03 $\mu H$. The wire consisted of five strand 31 guage wire. The transformer was of 10 turns and the tap for the primary winding comprised $\frac{1}{4}$ - $\frac{1}{2}$ of the lowest turn. The capacitors having the appropriate range to cause resonance at the frequency desired were connected in parallel with the winding.

The filter 38 includes a pair of input terminals 64 and a pair of output terminals 66. Connected between the input terminals and the output terminals are a plurality of $\pi$-type filter sections 68–74. The sections are identical in constructions except for the value of the end capacitors, as noted in greater detail below, and comprises a series inductor 76 connected in parallel with a variable capacitor 78. The shunt leg of the filter section comprises respective capacitors 80 and 82 that are respectively connected between the ends of the series inductor and a lead 84 that, in turn, is connected to ground. As noted above, and is conventional, the end shunt capacitors 86 and 88 of the filter have a different value than the intermediate capacitors. The output terminal from the amplifier 36 is connected to the midpoint of the filter sections through a pair of diodes 90 and 92 that are connected in inverse parallel relationship. The diodes 90 and 92 serve two purposes. On one hand, the diodes prevent the output impedance of the amplifier 36 from mismatching the filter. Additionally, the diodes prevent any noise that might be generated by the amplifier 36 from degrading the low noise performance of the low noise amplifier 40.

Connected across the output terminals 66 of the filter are reflecting means in the form of diodes 94 and 96 that are connected in inverse parallel relationship. The diodes are selected so that they conduct when a transmitter signal is received from the amplifier 36. In other words, the diodes reflect the transmitted signal which may propagate toward the terminals 66 back to the probe 24. On the other hand, the diodes 94, 96 do not conduct when a signal from the probe is propagated through the filter sections. Accordingly, the probe signal passes through the low noise amplifier which is connected to the terminals 66.

In an actual construction, the elements comprising the filter 38 had the following values:

| Capacitors: | |
|---|---|
| 80, 82 | 36$\mu\mu f$ |
| 86, 88 | 18$\mu\mu f$ |
| 78 | 7–25 $\mu\mu f$ |
| Inductors: | |
| 76 | 0.2$\mu H$ |
| Diodes: | |
| 90–96 | IN4148 |

The low noise amplifier may comprise, for example, the low noise amplifier manufactured and marketed by the United Development Corporation, of Lexington, Mass. 02173, and designated Model No. LNA-1. A schematic circuit wiring diagram of such amplifier is shown in FIG. 5 and comprises a pair of input terminals 98, 100 which are respectively connected to the output terminals 66 of the filter. The terminal 98 may be connected to the filter output through a feedthrough capacitor (not shown). Connected to the terminal 98 is a capacitor 102 which, in turn, is connected to the base electrode of a transistor 104. Also, connected to the base electrode of a transistor 104 is the junction of serially connected resistors 106 and 108. The other end of the resistor 108 is connected to ground lead 110 which is connected to the input terminal 100. The other end of the resistor 106 is connected to a DC supply terminal 112 through a series circuit comprising a resistor 114 and a diode 116, the anode electrode of which is connected to the terminal 112. A feedthrough capacitor 118 is connected between the terminal 112 and the diode 116. A resistor 120 is connected between the junction of resistors 106 and 114 and the collector electrode of the transistor 104. A capacitor 122 is also connected between the junction of the resistors 106, 114 and the lead 110. The emitter electrode of the transistor 104 is connected to ground through a parallel circuit comprising a resistor 124 and a capacitor 126.

The collector electrode of the transistor 104 is connected to a second amplifying stage through a coupling capacitor 128. More specifically, the capacitor 128 is connected to the base electrode of a transistor 130. The bias for the base electrode of the transistor 130 is obtained through the series circuit comprising resistors 132, 134, and 136 which is connected between the cathode electrode of the diode 116 and the ground lead 110. The base electrode of the transistor 130 is connected to the junction of the resistors 134, 136. Additionally, a resistor 138 is connected between the junction of resistors 132, 134 and the collector electrode of the transistor. Connected between the emitter electrode and the ground lead 110 is a parallel circuit comprising a resistor 140, a capacitor 142 and a variable capacitor 144 all of which are connected in series with a parallel circuit comprising a resistor 146 and a capacitor 148. Additionally, a capacitor 150 is connected, at one end, to the junction of resistors 132 and 138 and, at the other end, to the ground lead 110 through one end of the sheath of a coaxial cable 152. The other end of the sheath of the cable is connected to ground lead 110 through a lead 154. The central conductor of the cable 152 is connected to the collector electrode of the transistor 130 through a capacitor 156 and to the output terminal 158 through a feedthrough capacitor 160. Similarly, the ground lead 110 is connected to the output terminal 162 through a feedthrough capacitor 164.

In an actual construction of the low noise amplifier, the following values of elements was used:

| Resistors: | |
|---|---|
| 106 | 8.2K ohms |
| 108,134 | 2.7K ohms |
| 114 | 1.2K ohms |
| 120 | 820 ohms |
| 124 | 470 ohms |
| 132,146 | 470 ohms, ½W |
| 136 | 4.7K ohms |
| 138 | 51 ohms |
| 140 | 56 ohms |
| Capacitors: | |
| 102, 122, 126, 148, 156 | 0.01μf |
| 142 | 56μf |
| 144 | 9–35 μμf |
| Transistors: | |
| 104 | Avantec AT-17A |
| 130 | 2N3866 |
| Diodes: | |
| 116 | IN4004 |
| Feedthrough Capacitors: | |
| 118, 164 | 1,000μμf |
| DC Supply | 24 volts |

The circuit gain of the above-low noise amplifier is 30dB with a response of ±0.05dB/MHz from 2–110 MHz. The noise figure is 1.4dB.

Accordingly, a wide-band nuclear magnetic resonance spectrometer has been disclosed which can be utilized over a wide-band of NMR frequencies without changing any of the elements of the system.

While a preferred embodiment of the present invention has been shown and described, it will become obvious that numerous omissions, changes and additions may be made in such embodiment without departing from the spirit and scope of the present invention.

What is claimed is:

1. In a wide-band nuclear magnetic resonance spectrometer for determining the NMR frequency of a sample in an external magnetic field, a system comprising transmitting means for generating a signal having a frequency equal to the NMR frequency of the sample, receiving means for receiving the signal from the sample, and probe means for applying said signal from said transmitting means to the sample and for applying the signal from said sample to said receiving means, said probe means comprising a first coil adapted to be inductively coupled to the sample and connected across a capacitor to form a tank circuit resonant at the NMR frequency of the sample for detecting the signal of NMR frequency from the sample, and a second coil coupled by mutual inductance to said first coil for applying said sample signal to said receiving means.

2. A system as in claim 1, in which said probe means further comprises a transmitter coil connected to said transmitter means, and said first and second coil comprise a receiver coil connected to said receiving means and oriented orthogonally with respect to said transmitter coil.

3. A system as in claim 1, in which said first and second coils comprise an inductance for applying energy to and receiving energy from the sample, and said receiving means comprises reflecting means connected between said transmitting means and said probe for reflecting said transmitting means signal to said probe means.

4. A system as in claim 1, in which said capacitor is a variable capacitor.

5. A system as in claim 1, in which said first coil comprises a transformer having an output winding connected across said capacitor and electromagnetically coupled to the sample, and an input winding corresponding to said second coil connected to said reflecting means.

6. A system as in claim 5, in which said transformer comprises an autotransformer in which said second coil comprises a portion of said first coil and has a lesser number of turns than said first coil.

7. A system as in claim 1, in which said reflecting means comprises a filter having a pass band that includes said NMR frequency, said filter having output connections, and a pair of diodes connected in inverse parallel relationship across said output connections, whereby said diodes are rendered conductive when said transmitting means signal is applied thereto to reflect said signal back to said probe means and said diodes are rendered nonconducting when said signal is received from the sample.

8. A system as in claim 7, in which said receiving means further comprises a low noise amplifier connected to said output connections of said filter.

9. A system as in claim 3, in which said transmitting means comprises a transmitter for generating a fixed frequency signal, a first mixer connected to said transmitter, a variable frequency oscillator connected to said first mixer to cause said first mixer to produce said NMR frequency signal, and lead means for connecting said first mixer to said reflecting means; said receiving means comprising a second mixer connected to said variable frequency oscillator and said reflecting means for producing a signal having said fixed frequency, and a receiver connected to said second mixer for indicating reception of said fixed frequency signal.

10. A wide-band probe for a nuclear magnetic resonance spectrometer of the type operating over a wide band of frequencies and having spaced magnetic poles adapted to receive a sample having an NMR frequency therebetween, transmitting means for supplying energy to said probe, and receiving means having a preselected input impedance for receiving energy from said probe; said probe comprising a first coil adapted to be inductively coupled to the sample and connected across a capacitor to form a tank circuit resonant at the NMR frequency of the sample to detect the signal of NMR frequency from the sample, and a second coil coupled by mutual inductance to said first coil for applying said signal from said sample to the receiving means and for substantially matching impedances therebetween.

11. A wide-band probe as in claim 10, in which said probe comprises a transformer having an input winding corresponding to said second coil and an output winding corresponding to said first coil.

12. A wide-band probe as in claim 11, in which said capacitor comprises a variable capacitor.

13. A wide-band probe as in claim 11, in which said transformer comprises an autotransformer in which said second coil comprises a portion of said first coil.

14. A wide-band probe as in claim 13, in which said autotransformer first coil comprises a coil of five strand 31 gauge wire having a 13mm diameter and a length of 12mm, said coil having 10 turns, and said second coil comprises a tap on said autotransformer first coil comprising no more than ½ turn.

15. The combination of a low-pass filter and a wide-band probe wherein said low-pass filter is adapted to be connected between said probe and a receiving amplifier in a wide band nuclear magnetic resonance spectrometer of the type for detecting the NMR frequency of the sample received within the spectrometer and having a receiver that produces an intermediate frequency signal, said low-pass filter comprising a pair of input terminals adapted to be connected to said probe, a pair of output terminals adapted to said probe, a pair of output terminals adapted to be connected to the amplifier, filter means between said pairs of input and output terminals, transmitter signal input means connected to said filter means for applying a transmitter signal to said filter means, and reflecting means connected across said pair of output terminals for reflecting the transmitter signal from said pair of output terminals; said wide-band probe comprising a first coil adapted to be inductively coupled to the sample and connected across a capacitor to form a tank circuit resonant at the NMR frequency of the sample to detect the sample signal, and a second coil coupled by mutual inductance to said first coil to apply said sample signal to said filter and for substantially matching the impedance of the probe to the input impedance of the amplifier.

16. The combination of claim 15, in which said probe comprises an autotransformer in which said second coil is a portion of said first coil, a lead connecting said first coil across said capacitor, and to a lead connecting said second coil to said filter.

* * * * *